(12) United States Patent
Kresge et al.

(10) Patent No.: US 6,868,604 B2
(45) Date of Patent: Mar. 22, 2005

(54) METHOD FOR FORMING AN ELECTRICAL STRUCTURE

(75) Inventors: John S. Kresge, Binghamton, NY (US); Voya R. Markovich, Endwell, NY (US)

(73) Assignee: International Business Machines Corporation, Armonk, NY (US)

(*) Notice: Subject to any disclaimer, the term of this patent is extended or adjusted under 35 U.S.C. 154(b) by 86 days.

(21) Appl. No.: 10/338,962

(22) Filed: Jan. 8, 2003

(65) Prior Publication Data

US 2003/0101581 A1 Jun. 5, 2003

Related U.S. Application Data

(62) Division of application No. 09/328,189, filed on Jun. 8, 1999, now Pat. No. 6,559,388.

(51) Int. Cl.[7] .............................. H01K 3/10; H05K 1/18
(52) U.S. Cl. .............................. 29/852; 29/831; 29/841; 29/842; 29/846; 361/762
(58) Field of Search .................... 29/852, 842, 831, 29/846, 854, 832, 841; 361/746, 749, 795, 762; 174/260, 252, 262

(56) References Cited

U.S. PATENT DOCUMENTS

| | | | |
|---|---|---|---|
| 3,517,278 A | 6/1970 | Hager | |
| 4,705,205 A | 11/1987 | Allen et al. | |
| 4,932,883 A | 6/1990 | Hsia et al. | |
| 4,954,878 A | 9/1990 | Fox et al. | |
| 5,258,330 A | * 11/1993 | Khandros et al. | ............. 29/593 |
| 5,321,583 A | 6/1994 | McMahon | |
| 5,455,390 A | * 10/1995 | DiStefano et al. | .......... 174/262 |
| 5,468,681 A | 11/1995 | Pasch | |
| 5,504,035 A | 4/1996 | Rostoker et al. | |
| 5,518,964 A | * 5/1996 | DiStefano et al. | .......... 438/113 |
| 5,553,769 A | 9/1996 | Ellerson et al. | |
| 5,598,033 A | 1/1997 | Behlen et al. | |
| 5,615,477 A | 4/1997 | Sweitzer | |
| 5,619,399 A | 4/1997 | Mok | |
| 5,634,268 A | 6/1997 | Dalal et al. | |
| 5,635,718 A | 6/1997 | DePuydt et al. | |
| 5,682,061 A | 10/1997 | Khandros et al. | |
| 5,691,041 A | 11/1997 | Frankeny et al. | |
| 5,734,201 A | 3/1998 | Djennas et al. | |
| 5,738,531 A | 4/1998 | Beaman et al. | |
| 5,848,467 A | * 12/1998 | Khandros et al. | ............. 29/841 |
| 5,866,949 A | * 2/1999 | Schueller | ................... 257/778 |
| 5,983,492 A | * 11/1999 | Fjelstad | ...................... 29/843 |

* cited by examiner

*Primary Examiner*—Carl J. Arbes
*Assistant Examiner*—Tai Nguyen
(74) *Attorney, Agent, or Firm*—Schmeiser, Olsen & Watts; William H. Steinberg

(57) ABSTRACT

A method for forming an electrical structure. A substrate and a compliant layer are provided. A plated through hole (PTH) is formed through the compliant layer. A top pad is formed on a top surface of the compliant layer, wherein the top pad is electrically coupled to the PTH. A bottom pad is formed on a bottom surface of the compliant layer, wherein the bottom pad is electrically coupled to the PTH. A mask layer is applied to the bottom surface of the compliant layer, wherein the mask layer covers the bottom pad and an end of the PTH. The compliant layer is joined with the substrate, mechanically and electrically at the top pad. The portion of the mask layer is removed, wherein a portion of the bottom pad is exposed.

20 Claims, 5 Drawing Sheets

METHOD FOR FORMING AN ELECTRICAL STRUCTURE

This application is a divisional of U.S. Ser. No. 09/328,189; filed on Jun. 8, 1999 now U.S. Pat. No. 6,559,388.

BACKGROUND OF THE INVENTION

1. Technical Field

The present invention relates to a chip carrier (or chip) having an attached compliant layer of soft and spongy material, and associated method of fabrication, such that the compliant layer reduces thermally induced strains that would otherwise exist in solder joints that couple the chip carrier (or chip) to an electronic carrier such as a circuit card. The compliant layer acts as an interposer between the chip carrier (or chip) and the electronic carrier.

2. Related Art

An electronic assembly, such as a chip or chip carrier, is typically coupled to an electronic carrier, such as a circuit card, by a soldered interface. The soldered interface may include a conductive body such as a solder ball or a solder column. The resultant solder joints at the soldered interface are unfortunately subject to thermal stresses that occur during periods in which the electronic assembly/carrier configuration is heated or cooled. The thermal stresses, and consequent thermally induced strains, at the solder joints may arise from a mismatch in coefficient of thermal expansion (CTE) between the electronic assembly and the electronic carrier. For example, a circuit card made of epoxy, glass, etc. has a CTE of approximately 18 ppm/° C. In contrast, a ceramic chip carrier has a CTE of 3 to 6 ppm/° C. and an organic chip carrier has a CTE typically between 10 to 17 ppm/° C. Thus, thermal cycling with any of the preceding chip carriers and a circuit card is characterized by a materially greater rate of thermal expansion of the circuit card than the chip carrier. The thermal stresses and consequent strains resulting from the CTE mismatch during thermal cycling may cause fatigue failure in the solder joint at the soldered interface.

Another problem of thermally induced strain relates to large laminate carriers, such as large chip carriers, even where this is no mismatch of CTE. The problem arises from transient spatial effects in temperature, wherein the circuit card and regions of the chip carrier heat up or cool down at different rates during thermal cycling. Thus at a given time during a thermal transient, the circuit board and some regions of the chip carrier may be at different temperatures. If $\Delta T$ is the maximum temperature difference between the circuit board and the chip carrier at a given instant of time, the maximum differential rate of thermal expansion between the circuit card and the chip carrier at the given time, in units of ppm, is proportional to the product of CTE and $\Delta T$. Thus, thermal strains may be induced because of $\Delta T$ between different locations even if CTE does not vary between the different locations. Since the magnitude of $\Delta T$ during thermal cycling has a propensity to increase with increasing surface area of the chip carrier, it follows that thermally induced strain, due to $\Delta T$, tends to increase with increasing surface area of the chip carrier. While this $\Delta T$ problem may be tolerable with conventional chip carriers having typical dimensions of about 32 mm×32 mm, the $\Delta T$ problem is of concern with larger chip carriers having dimensions of about 50 mm×50 mm and larger. Thus, problems of thermally induced strain may be caused by a CTE mismatch, an unacceptably high $\Delta T$ in large chip carriers, or both.

A known and commonly used method of solving the aforementioned CTE problem is using long solder columns at the soldered interface. By distributing the total thermal stress over a long element, the local unit thermal stress is correspondingly reduced. The long solder columns would also mitigate the aforementioned problem of high $\Delta T$ between the chip carrier and the circuit card. A difficulty with long solder column approach, however, is that long solder columns introduce unwanted inductance into the electronic circuits, thereby degrading electronic performance.

A method is needed for solving the aforementioned problems of thermally induced stains such that electronic performance is not degraded.

SUMMARY OF THE INVENTION

The present invention discloses an electrical structure, comprising:

a substrate; and a compliant layer having a plated through hole (PTH), wherein a top surface of the compliant layer is attached to a bottom surface of the substrate at a first electrical contact, and wherein the PTH electrically couples the first electrical contact to a second electrical contact located on the bottom surface of the compliant layer.

The present invention also provides a method for forming an electrical structure, comprising the steps of:

providing a substrate;

providing a compliant layer;

forming a plated through hole (PTH) through the compliant layer;

forming a top pad on a top surface of the compliant layer, wherein the top pad is electrically coupled to the PTH;

forming a bottom pad on a bottom surface of the compliant layer, wherein the bottom pad is electrically coupled to the PTH;

applying a mask layer to the bottom surface of the compliant layer, wherein the mask layer covers the bottom pad and an end of the PTH;

joining the compliant layer with the substrate, mechanically and electrically at the top pad; and removing a portion of the mask layer, wherein a portion of the bottom pad is exposed.

The present invention has the advantage of relieving thermal stress at a soldered interface between an electronic assembly (such as a chip or chip carrier) and an electronic carrier (such as a circuit card) without introducing unwanted inductance. Thus the present invention reliably solves the thermal stress problem without adversely affecting electronic performance.

The present invention has the advantage of mitigating thermally induced bending stresses, despite the fact that the compliant layer of the present invention introduces an asymmetry in compliance and/or temperature, about the centerline of a chip carrier.

The present invention has the advantage of allowing users of ceramic substrates to continue to use ceramic substrates instead having to expend resources to switch to other materials having a CTE that is more favorable than the CTE of a ceramic substrate.

DETAILED DESCRIPTION OF THE INVENTION

Figure 1:
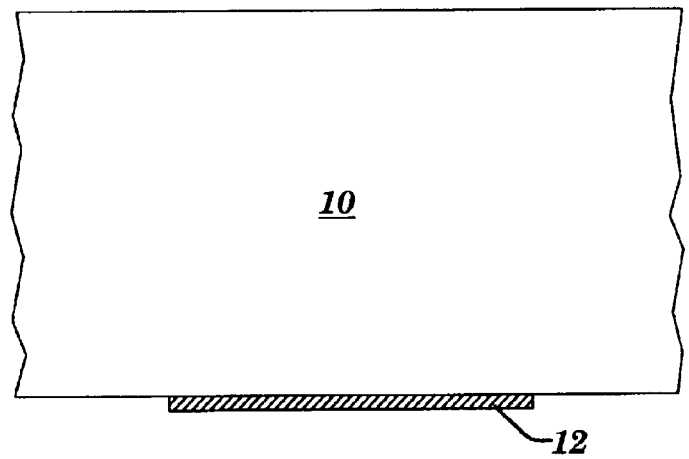
FIG. 1 depicts a front cross-sectional view of substrate, in accordance with a preferred embodiment of the present invention.

FIG. 1 illustrates a front cross-sectional view of a substrate 10 with an attached conductive pad 12 associated with a preferred embodiment of the present invention. The substrate 10 represents a portion of an electronic assembly such as a chip carrier or chip. Although the surface area of a conventional chip carrier is typically about 32 mm×32 mm, the scope of the present invention includes chip carriers of all sizes including those of 50 mm×50 mm and larger. The conductive pad 12 includes a conductive material such as copper. The substrate 10 may include, inter alia, a ceramic material or an organic material. The conductive pad 12, as well as any other pad referred to in the remaining FIGS. 2–10, generally represents an electrical contact medium. A compliant layer 20, as shown in FIG. 5 and discussed infra, will be subsequently attached to the substrate 10 at the pad 12.

Figure 2:
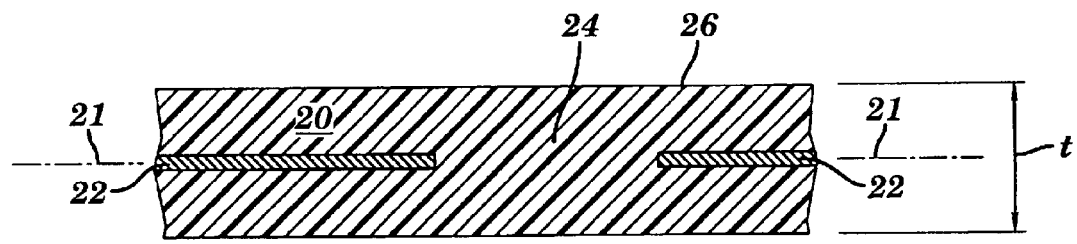
FIG. 2 depicts a front cross-sectional view of a compliant layer, in accordance with the preferred embodiment of the present invention.

FIG. 2 illustrates a front cross-sectional view of a compliant layer 20, in accordance with the preferred embodiment. The compliant layer has a thickness between about 0.1 mm and about 1.0 mm. The compliant layer includes a compliant material that is soft and spongy, such that the compliant material is characterized by a elastic modulus in a range of about 100,000 psi to about 300,000 psi. An example of such compliant material is the Rogers RO2800 fluoropolymer material which has a elastic modulus of about 150,000 psi. The compliant layer 20 may be difficult to handle because its shape may be highly sensitive to small locally applied forces. To improve handling, the compliant layer 20 may optionally include a sheet of material 22 whose CTE is close to that of the compliant material of the compliant layer 20. The sheet of material 22 may include a metal or metallic alloy, such as copper, stainless steel, Invar (alloy containing about 63.8% iron, 36% nickel, and 0.2% carbon), or copper-clad Invar. The sheet of material 22 has some rigidity, which improves the mechanical stability of the compliant layer 20. The sheet of material 22 should be located close to the centerline 21 of the compliant layer 20. It is preferred that the sheet of material 22 be displaced from the centerline 21 of the compliant layer 20 by no more than about 5% of the thickness (t) of the compliant layer 20. The sheet of material 22 includes a gap 24 that can accommodate a plated through hole (PTH) through the thickness of the compliant layer 20. The gap 24 diameter will typically range from about 8 mils to about 20 mils.

Figure 3:
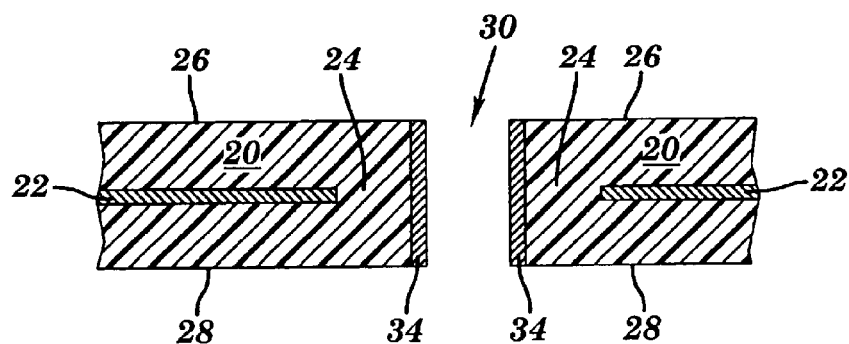
FIG. 3 depicts FIG. 2 after a plated through hole has been formed in the compliant layer.

FIG. 3 illustrates a PTH 30 formed in the compliant layer 20 of FIG. 2. The PTH passes through the gap 24. The PTH 30 includes a hole 32, and a metallic plating material 34 such as copper. The PTH 30 may be formed by any method known to one of ordinary skill in the art, such as by laser drilling a hole in the compliant layer 20, followed by plating the hole with the metallic plating material 34. The conductive plating material 34 of the PTH 30 allows a subsequent electrical connection to be made between the top surface 26 of the compliant layer 20 and the bottom surface 28 of the compliant layer 20.

Figure 4:
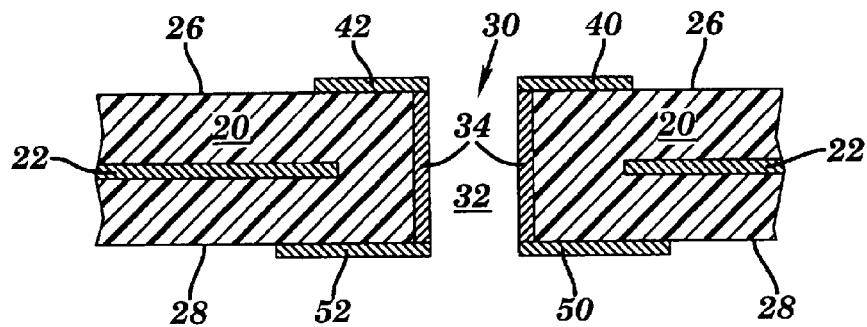
FIG. 4 depicts FIG. 3 after conductive pads have been formed on the top and bottom surfaces of the compliant layer.
Figure 5:
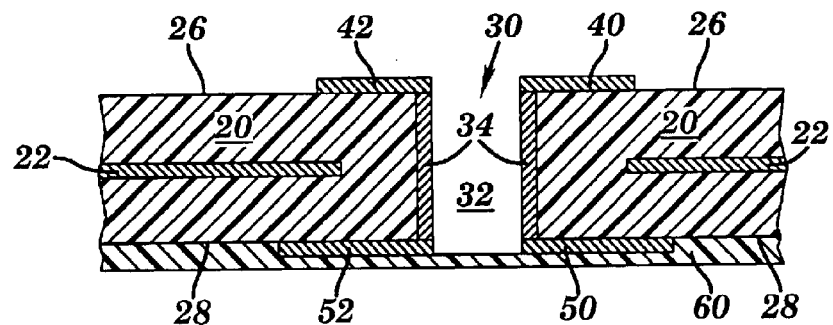
FIG. 5 depicts FIG. 4 after a mask layer has been applied to the bottom surface of the compliant layer.

FIG. 4 illustrates FIG. 3 after top conductive pads 40 and 42 have been formed on the top surface 26 of the compliant layer 20, and after bottom conductive pads 50 and 52 have been formed on the bottom surface 28 of compliant layer 20. The top conductive pads 40 and 42, and bottom conductive pads 50 and 52, each include a conductive material such as copper, and each has been formed to be in electrical and mechanical contact with the plating material 34 of the PTH 30.

FIG. 5 illustrates FIG. 4 after a mask layer 60 has been formed on the bottom surface 28 of the compliant layer 20. The mask layer 60 covers the hole 32 and bottom pads 50 and 52. The mask layer 60 may include a solder mask material, such as a polyimide, that is capable of withstanding a temperature of at least about 360° C. The mask layer 60 may be subjected to a temperature of about 360° C. in the joining step described infra for FIG. 7. The mask layer 60 electrically insulates and mechanically protects the bottom surface 28 of the compliant layer 20.

Figure 6:
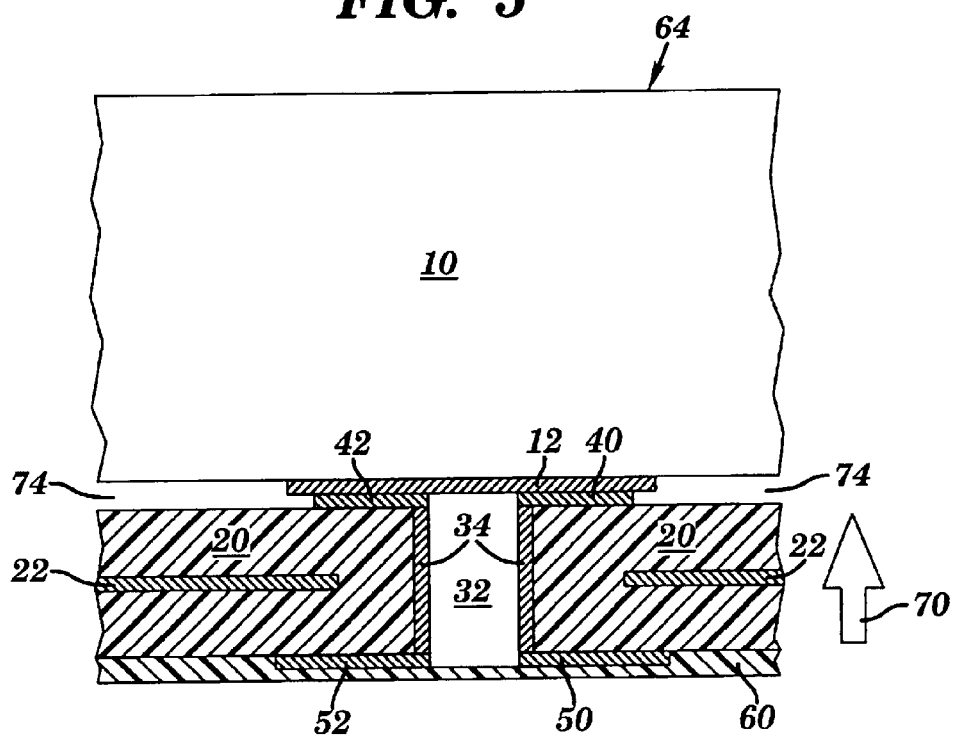
FIG. 6 depicts the compliant layer of FIG. 5 placed in contact with the substrate of FIG. 1.

FIG. 6 illustrates the compliant layer 20 of FIG. 5 placed in contact with the substrate 10 of FIG. 1 to form a composite structure 64, such that the top conductive pads 40 and 42 of the compliant layer 20 are each in contact with the conductive pad 12 of the substrate 10. There is a gap 74 between the substrate 10 and the compliant layer 20 due to the thicknesses of the top conductive pads 40 and 42 and the conductive pad 12.

Figure 7:
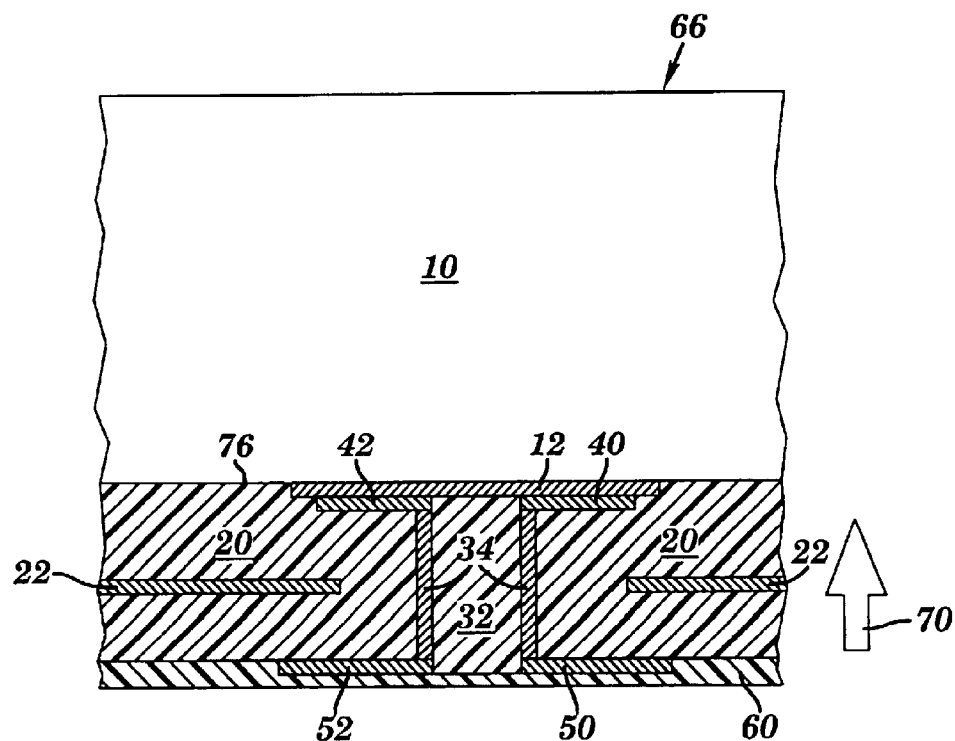
FIG. 7 depicts FIG. 6 after the compliant layer and the substrate are joined together.

FIG. 7 shows FIG. 6 after the substrate 10 and the compliant layer 20 are joined together such that the top conductive pads 40 and 42 of the compliant layer 20 are each electrically and mechanically joined to the conductive pad 12 of the substrate 10. Any joining technique known to one skilled in the art may be used, such as transient liquid phase bonding. A manner of employing transient liquid phase bonding is to plate (or otherwise apply) solid tin and solid gold to the top conductive pads 40 and 42, the conductive pad 12, or both. The composite structure 64 of FIG. 6 is placed into a lamination press and subjected to heat (between about 280° C. and about 330° C.) and pressure (between about 200 psi and about 500 psi), for a time of at least 15 minutes. The preceding process causes the lead and gold to first interdiffuse, then liquify as the eutectic mixture is approached, and finally resolidify with continued interdiffusion of lead and gold. The resolidification causes the top conductive pads 40 and 42 to be electrically and mechanically bonded to the conductive pad 12. Many other metallic combinations may be used instead of lead and gold, such as tin and bismuth. The preceding joining process transforms the composite structure 64 of FIG. 6 into the transformed structure 66 of FIG. 7. The application of heat and pressure also causes the compliant material of the compliant layer 20 to move in the direction 70 shown in both FIGS. 6 and 7, to fill the gap 74 shown in FIG. 6. As a result, the gap 74 in FIG. 6 is absent in FIG. 7.

Figure 8:
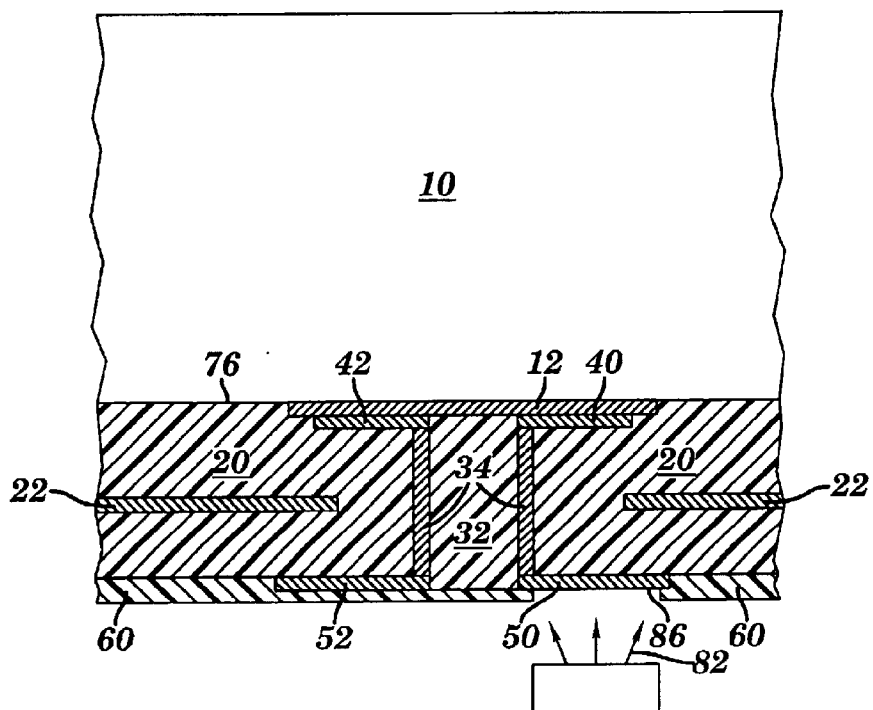
FIG. 8 depicts FIG. 7 after a portion of the mask layer is removed so as to expose a portion of a conductive pad on the bottom surface of the compliant layer.

FIG. 8 illustrates FIG. 7 after a portion of the mask layer 60 is removed so as to form an exposed surface 86 of the bottom pad 50. Any known process may be used to accomplished the removal. A preferred process is that of laser ablation, using light 82 directed by a laser 80 unto a portion of the mask layer 60 that covers the bottom pad 50. After the exposed surface 86 is formed, a conductive body such as a solder ball or a solder column may be electrically and mechanically attached to the exposed surface 86.

Figure 9:
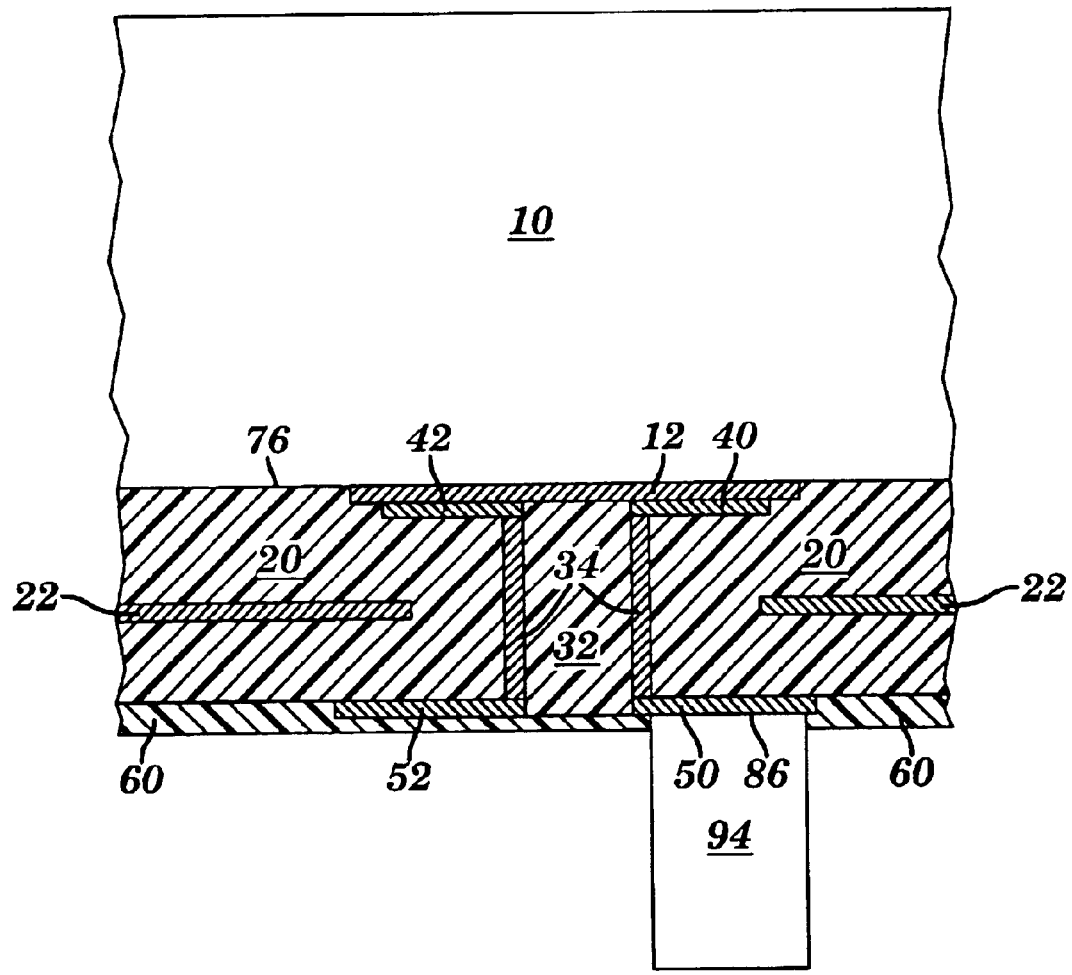
FIG. 9 depicts FIG. 8 after a solder column has been attached to the exposed pad.
Figure 10:
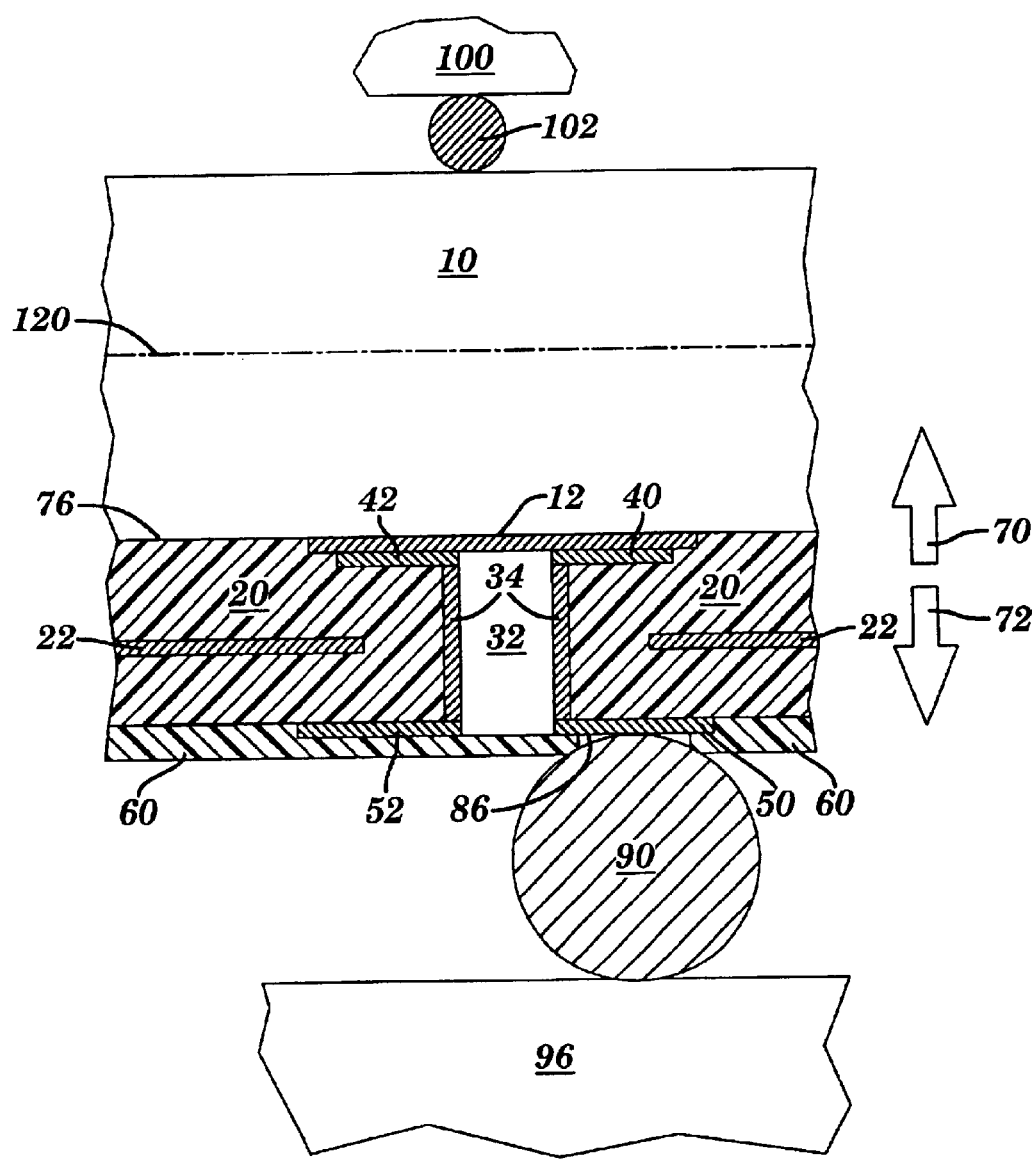
FIG. 10 depicts FIG. 8 after a solder ball has been attached to the exposed pad, and with an attached chip and an attached electronic carrier.

FIG. 9 illustrates FIG. 8 after a solder column 94 is electrically and mechanically attached to the exposed surface 86. FIG. 10 illustrates FIG. 8 after a solder ball 90, such as a ball of a ball grid array, is electrically and mechanically attached to the exposed surface 86. FIG. 10 also shows the solder ball 90 attached to an electronic carrier 96, such as a circuit card, such that the compliant layer 20 is electrically attached to the electronic carrier 96. FIG. 10 further shows a chip 100 attached to the substrate 10 at a solder connector 102 such as a solder ball formed by controlled collapse chip connection (C4).

The compliant layer 20 in FIG. 10 acts as an interposer between the substrate 10 and the electronic carrier 96, such that thermal strains that would otherwise act at solder joints associated with the solder ball 90 during thermal cycling are transferred into small motions of the compliant material of the compliant layer 20. Thus, the compliant material of the compliant layer 20 effectively dissipates the strain energies induced during thermal cycling.

The existence of the compliant layer 20 in FIG. 10 causes a non-symmetric distribution of material about the centerline 120 of the substrate 10. A geometric asymmetry of this type, coupled with the associated asymmetry in compliance and/or temperature, generally causes the material of the substrate 10 to bend either upward (in direction 70) or downward (in direction 72) during thermal cycling. Nonetheless, the soft and spongy material of the compliant layer 20 effectively absorbs the bending energy, thereby enabling the substrate 10 to maintain its flatness, and avoid bending, during thermal cycling.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming an electrical structure, comprising the steps of:
   providing a substrate;
   providing a compliant layer;
   forming a plated through hole (PTH) through the compliant layer;
   forming a top pad on a top surface of the compliant layer, wherein the top pad is electrically coupled to the PTH;
   forming a bottom pad on a bottom surface of the compliant layer, wherein the bottom pad is electrically coupled to the PTH;
   applying a mask layer to the bottom surface of the compliant layer, wherein the mask layer covers the bottom pad and an end of the PTH;
   joining the compliant layer with the substrate, mechanically and electrically at the top pad; and
   removing a portion of the mask layer, wherein a portion of the bottom pad is exposed.

2. The method of claim 1, wherein the step of providing a substrate includes selecting a substrate from the group consisting of a substrate of ceramic material and a substrate of organic material.

3. The method of claim 1, wherein the step of providing a compliant layer comprises providing a layer of compliant material having a sheet of material selected from the group consisting of a metal and a metallic alloy and displaced from a centerline of the compliant layer by no more than about 5% of a thickness of the compliant layer.

4. The method of claim 1, wherein the step of providing a compliant layer includes providing a layer of compliant material having a elastic modulus between about 100,000 and about 300,000 psi.

5. The method of claim 1, wherein the step of providing a compliant layer includes providing a layer of compliant material having a thickness between about 0.1 mm and about 1.0 mm.

6. The method of claim 1, wherein the joining step is accomplished by transient liquid phase bonding the compliant layer with the substrate.

7. The method of claim 1, wherein the removing step is accomplished by laser ablating the portion of the mask layer.

8. The method of claim 1, further comprising coupling an electronic assembly mechanically and electrically to a top surface of the substrate.

9. The method of claim 1, further comprising after the removing step, mechanically and electrically attaching a conductive body to the exposed portion of the bottom pad.

10. The method of claim 9, further comprising before the attaching step: selecting the conductive body from the group consisting of a solder ball and a solder column.

11. The method of claim 9, further comprising coupling an electrical carrier mechanically and electrically to the conductive body.

12. The method of claim 11, wherein the electrical carrier is a circuit card.

13. The method of claim 8, wherein the electronic assembly is a chip.

14. The method of claim 8, wherein the electronic assembly is a chip carrier.

15. The method of claim 3, wherein the sheet of material consists of the metal.

16. The method of claim 15, wherein the metal is copper.

17. The method of claim 3, wherein the sheet of material consists of the metallic alloy.

18. The method of claim 17, wherein the metallic alloy is stainless steel, Invar, or copper-clad Invar.

19. The method of claim 1, wherein the mask layer comprises a polyimide.

20. The method of claim 1, wherein the applying step comprises applying the mask layer to the bottom surface of the compliant layer such that the mask layer is in direct mechanical contact with the bottom pad, the end of the PTH, and the compliant layer.

* * * * *